US009660639B2

(12) United States Patent
Roberts et al.

(10) Patent No.: US 9,660,639 B2
(45) Date of Patent: May 23, 2017

(54) DISTRIBUTED DRIVER CIRCUITRY INTEGRATED WITH GAN POWER TRANSISTORS

(71) Applicant: GaN Systems Inc., Ottawa (CA)

(72) Inventors: John Roberts, Kanata (CA); Ahmad Mizan, Kanata (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/091,867

(22) Filed: Apr. 6, 2016

(65) Prior Publication Data

US 2016/0301408 A1    Oct. 13, 2016

Related U.S. Application Data

(60) Provisional application No. 62/145,107, filed on Apr. 9, 2015.

(51) Int. Cl.
*H03K 3/00* (2006.01)
*H03K 17/16* (2006.01)
(Continued)

(52) U.S. Cl.
CPC ......... *H03K 17/162* (2013.01); *H03K 17/168* (2013.01); *H03K 17/6877* (2013.01);
(Continued)

(58) Field of Classification Search
None
See application file for complete search history.

(56) References Cited

U.S. PATENT DOCUMENTS 8,054,110 B2 * 11/2011 Wang ............ H03K 19/018521
327/108
8,531,233 B2    9/2013 Tasaka
(Continued)

FOREIGN PATENT DOCUMENTS

WO    2014094115 A1    6/2014
WO    2015061881 A1    5/2015
(Continued)

OTHER PUBLICATIONS

Notice of References Cited issued with Notice of Allowance on related U.S. Appl. No. 15/099,459 dated Aug. 17, 2016.
(Continued)

*Primary Examiner* — Lincoln Donovan
*Assistant Examiner* — Khareem E Almo
(74) *Attorney, Agent, or Firm* — Miltons IP/p.i.

(57) ABSTRACT

Power switching systems are disclosed comprising driver circuitry for enhancement-mode (E-Mode) GaN power transistors with low threshold voltage. Preferably, a GaN power switch (D3) comprises an E-Mode high electron mobility transistor (HEMT) with a monolithically integrated GaN driver. D3 is partitioned into sections. At least the pull-down and, optionally, the pull-up driver circuitry is similarly partitioned as a plurality of driver elements, each driving a respective section of D3. Each driver element is placed in proximity to a respective section of D3, reducing interconnect track length and loop inductance. In preferred embodiments, the layout of GaN transistor switch and the driver elements, dimensions and routing of the interconnect tracks are selected to further reduce loop inductance and optimize performance. Distributed driver circuitry integrated on-chip with one or more high power E-Mode GaN switches allows closer coupling of the driver circuitry and the GaN switches to reduce effects of parasitic inductances.

15 Claims, 6 Drawing Sheets

(51) Int. Cl.
  *H03K 17/687* (2006.01)
  *H01L 29/20* (2006.01)
  *H01L 29/40* (2006.01)
  *H01L 29/417* (2006.01)

(52) U.S. Cl.
  CPC ........ *H01L 29/2003* (2013.01); *H01L 29/402* (2013.01); *H01L 29/41758* (2013.01)

(56) References Cited

U.S. PATENT DOCUMENTS

| | | | |
|---|---|---|---|
| 8,593,211 | B2 | 11/2013 | Forghani-Zadeh et al. |
| 8,766,711 | B2 | 7/2014 | Takemae |
| 8,947,154 | B1 | 2/2015 | Shah et al. |
| 9,105,560 | B2 | 8/2015 | Roberts et al. |
| 9,312,769 | B2 * | 4/2016 | Stratakos |
| 9,525,413 | B2 * | 12/2016 | Roberts ............ H03K 17/04123 |
| 9,543,940 | B2 * | 1/2017 | Wang ..................... H03K 17/16 |
| 2013/0187713 | A1 | 7/2013 | Acar et al. |
| 2013/0241621 | A1 * | 9/2013 | Forghani-Zadeh  H03K 17/08122 327/315 |
| 2014/0070786 | A1 | 3/2014 | Guerra et al. |
| 2014/0092508 | A1 | 4/2014 | Ko et al. |
| 2014/0175454 | A1 | 6/2014 | Roberts et al. |
| 2015/0097613 | A1 | 4/2015 | Roewe et al. |
| 2015/0318851 | A1 | 11/2015 | Roberts et al. |

FOREIGN PATENT DOCUMENTS

| | | | |
|---|---|---|---|
| WO | 2015135072 | A1 | 9/2015 |
| WO | 2015157845 | A1 | 10/2015 |

OTHER PUBLICATIONS

International Search Report issued on International Application No. PCT/CA2015/000168 mailed Jun. 18, 2015; 3 pages.

Boutros, K. S. et al.; "GaN Power Electronics for Automotive Applications"; IEEE; 2012; Energytech; http://toc.proceedings.com/15872webtoc.pdf; pp. 1-4.

Roberts, John; "Lateral GaN Transistors—A Replacement for IGBT devices in Automotive Applications"; PCIM Europe 2014; International Exhibition and Conference for Power Electronics, Intelligent Motion, Renewable Energy and Energy Management; May 20-22, 2014; pp. 310-317.

Lidow, A.; "The GaN Journey Begins", IEEE SCV Electron Devices Society (EDS), Oct. 12, 2010; pp. 1-28.

Texas Instruments Inc.; Datasheet; LM5113 5A, 100V Half-Bridge Gate Driver for Enhancement Mode GaN FETs; SNVS725F—Jun. 2011—Revised Apr. 2013; pp. 1-21.

GaN Systems Inc.; Application Note: "How to Drive GaN Enhancement Mode Power Switching Transistors"; GN001, Rev. Oct. 21, 2014; pp. 1-13.

Strydom, J. & Lidow, A.; "Driving eGaN Transistors for Maximum Performance"; Darnell Power Forum; Sep. 2010; pp. 1-8.

Lidow, A. & Strydom, J.; "The eGaN FET Journey Begins"; IBM Power Symposium; May 2011.

Strydom, J.; "Driving eGaN (TM) FETs"; Bodo's Power Systems; Nov. 2010; www.bodospower.com; pp. 50-52.

Strydom, J.; "The eGaN (TM) FET-Silicon Power Shoot-out: 2: Drivers, Layout"; Power Electronics Technology; Jan. 2011; www.powerelectronics.com; pp. 14-19.

Roberts et al.; "Integrated Gate Drivers for e-Mode Very High Power GaN Transistors"; IEEE; 2015; pp. 16-19.

* cited by examiner

DISTRIBUTED DRIVER CIRCUITRY INTEGRATED WITH GAN POWER TRANSISTORS

CROSS-REFERENCE TO RELATED APPLICATIONS

This application claims priority from U.S. Provisional patent application No. 62/145,107, filed Apr. 9, 2015, entitled "Distributed Driver Circuitry Integrated with GaN Power Transistors", which is incorporated herein by reference in its entirety.

This application is related to PCT International patent application No. PCT/CA2015/00168 filed Mar. 10, 2015, (Publication No. WO2015135072) entitled "Power Switching Systems comprising High Power E-Mode GaN Transistors and Driver Circuitry", which claims priority from U.S. Provisional Patent application No. 61/951,679, filed Mar. 12, 2014, of the same title; this application is also related to PCT International Patent Application No. PCT/CA2013/001019, filed Dec. 12, 2013, (Publication No. WO2014/094115), and U.S. patent application Ser. No. 14/654,127 (Publication No. US 20150318851), filed Dec. 13, 2013, both entitled entitled "Devices And Systems Comprising Drivers For Power Conversion Circuits", which claims priority from U.S. provisional patent application No. 61/740,825, filed 21 Dec. 2012; U.S. patent application Ser. No. 14/105,569 (Publication No. US 20140175454), filed Dec. 13, 2013, entitled "Devices and Systems for Power Conversion Circuits", which claims priority from U.S. provisional patent application No. 61/740,821, filed 21 Dec. 2012; and PCT application No. PCT/CA2015/000244, filed 16 Apr. 2015 (Publication No. WO2015157845) entitled "Embedded packaging for Devices and Systems comprising Lateral GaN Power Transistors", which claims priority from U.S. Provisional Patent Application No. 61/980,101, entitled "Embedded Packaging With Low Inductance/Low Resistance Interconnect For Large Lateral GaN Power Transistors And Other Nitride Semiconductor Power Devices"; all of these applications are incorporated herein by reference in their entirety.

TECHNICAL FIELD

This invention relates to devices and systems comprising high voltage Gallium Nitride (GaN) transistors, such as GaN power switches for automotive and other applications, and particularly relates to large area GaN power transistors for rapid switching of high currents.

BACKGROUND

Several groups of researchers are experimenting and reporting on GaN transistors that are aimed at replacing Si IGBTs (silicon-based insulated-gate bipolar transistors). Advantages of GaN devices are summarized in an article by Boutros, Chu and Hughes, entitled "GaN Power Electronics for Automotive Applications", (IEEE 2012 Energytech-http://toc.proceedings.com/15872webtoc.pdj). For example, for automotive applications, there is a demand for low-loss power semiconductor switches for high-current/high-voltage electric propulsion units, e.g. 200 A to 600 A and 100 V to 600 V. GaN switches are expected to offer ~100× performance over silicon-based devices, owing to superior material properties such as high electron mobility and high breakdown field and capability to provide GaN power electronics with low on-resistance and fast switching, and higher operating temperatures (John Roberts, "Lateral GaN Transistors-A Replacement for IGBTs in Automotive Applications", PCIM Europe 2014; International Exhibition and Conference for Power Electronics, Intelligent Motion, Renewable Energy and Energy Management; Proceedings of; 20-22 May 2014).

At present, very few high-voltage GaN devices for automotive applications are available on the open marketplace. However, as these devices reach maturity, it is expected that GaN power switches will be introduced into the automotive market for a number of applications such as power generators, power conversion units and electronically controlled on-demand accessories.

For safe operation, normally-off GaN devices with high current and voltage capability are required. Normally-off operation may be provided by series connecting a normally-on GaN transistor with a driver MOSFET in cascode configuration. Alternatively an enhancement mode (E-Mode) normally-on GaN transistor may be used.

A cascode structure can use a conventional MOSFET or a custom structured MOSFET to provide a threshold voltage that approximates to or has an advantage over an IGBT device, e.g. ~3V and ~5V for Silicon SJ MOSFETS and Silicon IGBT devices respectively. Alternatively, a normally-off E-Mode GaN transistor can be used. However, E-Mode GaN devices generally have very low threshold voltages, typically 1.5V or less. A low threshold voltage poses a significant problem for safe operation, particularly with respect to noise issues and parasitic elements which could cause voltage spikes or noise in excess of the threshold voltage, thus unintentionally turning on the device. Clearly, unintentional or false switching could be a potential safety hazard for high current and high voltage applications, such as, automotive applications. While it would be desirable to have threshold voltages of 3V or more for high power applications, currently, few vendors offer E-Mode GaN devices with threshold voltages above 2V, and devices with threshold voltages above 3V are rare. Thus, to manage transients caused by noise issues and parasitic elements and ensure safe operation, low threshold voltage E-Mode GaN transistors require carefully designed driver circuitry with signal isolators, isolated +VE and −VE power supplies and a source-sense Kelvin connection.

In addition to considering the potential for noise to cause false switching, another issue for safe operation is the Miller capacitance effect. The latter could result in the power transistor being turned back on when the gate is being taken low.

The use of discrete components and separate driver circuits necessitates interconnection of the components by wire-bonding or other interconnect technologies, which introduces unwanted (parasitic) inductance.

Drivers for cascode GaN devices are disclosed in the above referenced co-pending applications: International Patent Application No. PCT/CA2013/001019 (Publication No. WO2014/094115) entitled "Devices and Systems Comprising Drivers for Power Conversion Circuits"; and U.S. patent application Ser. No. 14/105,569 (Publication No. US 20140175454), entitled "Devices and Systems for Power Conversion Circuits". These patent applications disclose driver circuits and packaging arrangements for a cascode configuration GaN device, which seek to address one or more issues of thermal management, series inductance and resistance, to reduce or manage unwanted noise and voltage transients, and enable lower cost and more compact systems and devices for electronic power conversion circuits.

For E-Mode GaN devices, which have lower threshold voltages, the use of discrete driver circuitry poses even more significant challenges in managing these issues with noise and parasitic elements, including Miller capacitance effects. Accordingly, there is a need for improved solutions using integrated drivers for E-Mode GaN devices.

Drivers for E-mode GaN devices are disclosed in the above referenced PCT International patent application No. PCT/CA2015/000168 (Publication No. WO2015135072), filed Mar. 10, 2015, entitled "Power Switching Systems Comprising High Power E-Mode GaN Transistors and Driver Circuitry", which claims priority from U.S. Provisional Patent application No. 61/951,679, filed Mar. 12, 2014 entitled "Power Switching Systems Comprising High Power E-Mode GaN Transistors and Driver Circuitry". Design guidelines and circuit layer considerations for E-mode drivers are also discussed in more detail, with an example of a particular reference design, in an Application note issued by GaN Systems Inc. (GN001 Rev. 2014-10-21), October 2014, entitled "How to Drive GaN Enhancement Mode Power Switching Transistors".

Nevertheless, several difficulties associated with driver requirements for E-mode GaN transistors are becoming apparent as the voltage and current handling capability of these GaN transistors continues to improve.

Normally-off or E-mode devices typically have threshold voltages of only 1-2 Volts. This low threshold voltage presents a difficult challenge when external driver devices are used because of the large inductive loop of the extended printed circuit connection tracks that are needed. The inductive elements combine with the distributed and transistor capacitances so that an overshoot voltage plus an extended oscillatory ringing signal is inevitably present.

The Miller Ratio ($Q_{GD}/Q_{GS}$) provides an indication of how sensitive a switching transistor is to false, unwanted switching. As the rated voltage increases the GaN transistor Miller Ratio degrades. Thus, higher voltage GaN transistors are more susceptible to false, unwanted—transient operation than low voltage GaN transistors.

The need to overcome these driver difficulties was recognized some years ago, at the time small low voltage GaN transistors were first introduced, for example, as disclosed in a presentation at the Darnell Power Forum, September 2010 by A. Lidow entitled "The GaN Journey Begins" and related references from Efficient Power Corporation.

Figure 1:
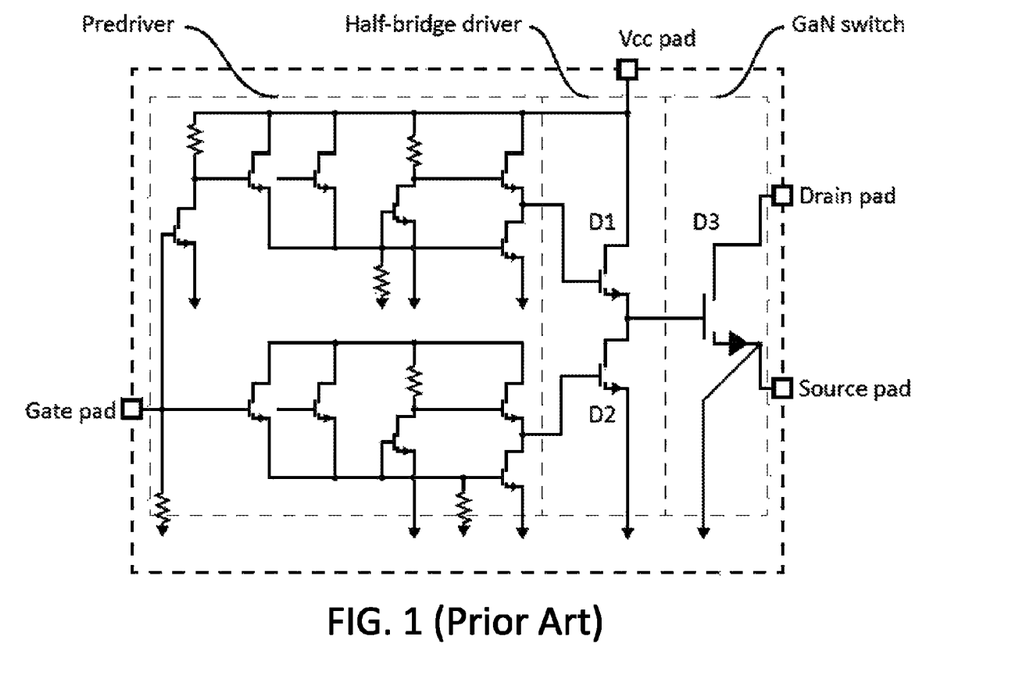
FIG. 1 (Prior Art) shows a circuit schematic of a device comprising a GaN transistor D3; driver circuitry comprising pull-up and pull-down driver transistors, D1 and D2, respectively; and a pre-driver.
Figure 2:
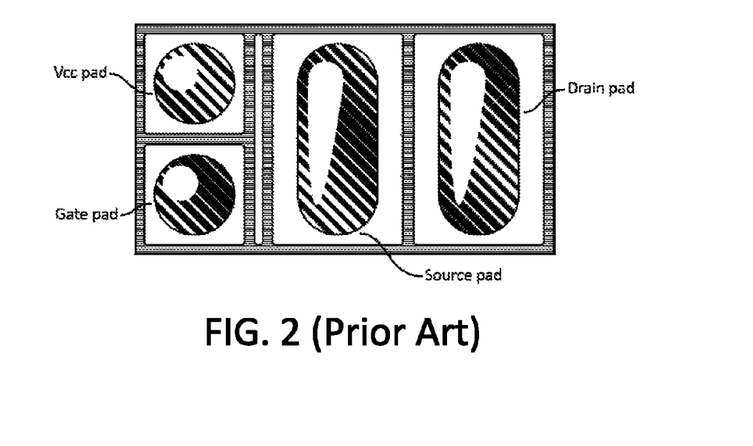
FIG. 2 (Prior Art) shows a diagram representing schematically the external pads for source, drain, gate and Vcc connections for the device of FIG. 1.

Although discrete drivers can be used, it is apparent that on-chip drivers offer significant advantages and are likely to become universal in the future. An implementation of a driver circuit based on the above referenced circuit disclosed by Lidow, is illustrated in the circuit schematic of FIG. 1. As shown in FIG. 1, the switching transistor is a small low voltage GaN device D3 that has a pair of GaN transistors D1 and D2 driving its gate electrode to Vcc and ground. The control is therefore transferred and made at the Gate Pad of the integrated driver circuit. The on-chip driver circuitry comprises a pair of series connected GaN transistors D1 and D2. In this configuration, the driver supply voltage Vcc is connected to the drain electrode of D1 while the source electrode of D2 is grounded. The pre-driver circuitry comprises a series of integrated inverter stages to provide a pair of non-overlapping antiphase signals to driver transitions D1 and D2. However, there are drawbacks with this arrangement. The on-chip inductance issue is not addressed and the drive level presented to the large switching transistor D3 is one threshold voltage lower than the supply voltage. In this design, unless the gate drive voltage can be cleanly driven to Vcc, the gate drive voltage may be inadequate to drive D1 effectively.

As disclosed in the above referenced PCT International Patent application No. PCT/CA/2015/000168 (Publication No. WO2015135072), it can be beneficial to provide boost circuitry to provide higher gate drive voltage for the high-side, i.e. pull-up, drive transistor D1. A higher drive voltage, e.g. 10V, is supplied to the gate of D1 to produce firm and rapid pull-up of D1 for improved switching performance at higher switching speeds. Partitioning the driver circuitry enables high current handling components to be integrated closely with the GaN switch and directly coupled, to reduce inductance. Provision of both internal and external source-sense (Kelvin) connections separates the gate loop from the drain-source loop to further reduce the adverse effects of parasitic inductances. A separate pre-driver module or chip, with either discrete or integrated components, allows for the pre-driver to be thermally separated from the GaN chip, e.g. to enable use of lower cost MOSFET pre-drivers.

The following references, and other references cited therein, provide further background information on drivers for GaN FETS:

a) Texas Instruments Inc. Datasheet LM5113 5A, 100V Half-Bridge Gate Driver for Enhancement Mode GaN FETS (SNVS725F—JUNE 2011—REVISED APRIL 2013);
b) U.S. Pat. No. 8,593,211 to Forghani-Sadeh (Texas Instruments Inc.) entitled "System and apparatus for driver circuit for protection of gates of GaN FETS";
c) U.S. Pat. No. 8,766,711 to Takemae (Transphorm Japan Inc.) entitled "Switching Circuit with Controlled Driver Circuit".

In considering the effects of parasitic inductances, it is necessary to consider inductances of on-chip wiring or interconnect, as well as inductances of the interconnection between the chip and the package. It will be apparent that for very large GaN transistors, for example, a device having an area of ~1 cm$^2$ or more, e.g. a die size of about 10 mm×10 mm, the length of on-chip wiring or interconnect tracks extending between the driver circuitry and electrodes of a large area GaN transistor can also introduce significant parasitic on-chip inductances. For high speed switching, it is desirable to have coherent synchronous turn-on/ turn-off across all elements of a large area GaN transistor. As will be explained in detail more below, with reference to FIG. 3, a very large area GaN transistor may be partitioned into sections, and each section is coupled to the driver circuit by differing lengths of source, drain and gate interconnections. This arrangement, introduces different amounts of parasitic inductance which can result in inductance dependent on the length of interconnect between the driver circuit and the different sections. For fast switching edges, this can lead to out of phase or dissynchronous operation across the different sections of the transistor. Known solutions do not adequately address this issue.

There is a need for further improvements in on-chip drive circuitry, particularly for use with large area, very high voltage, high current, GaN transistors.

The present invention seeks to overcome, or mitigate, one or more of the above-mentioned disadvantages or limitations of these known systems and devices, or at least provide an alternative.

SUMMARY OF INVENTION

Aspects of the invention provide systems and devices comprising high power E-Mode GaN switches and driver circuitry.

One aspect of the invention provides a system comprising a large area GaN power transistor which is arranged as a plurality of sections, and a distributed driver comprising a plurality of driver elements, each driving a respective one of the sections of the large GaN power switch.

Another aspect of the invention provides a GaN switching device comprising: a large area lateral GaN power transistor (GaN FET) arranged as a plurality of sections, and a distributed driver comprising a plurality of driver elements, each driver element comprising a high-side, pull-up driver transistor and a low-side, pull-down driver transistor connected in series, wherein the output of each one of the distributed driver elements is selectively connected to drive a respective one of the sections of the large GaN power transistor.

Another aspect of the invention provides a GaN switching device comprising: an enhancement mode (E-Mode) GaN switch having an integrated GaN driver, the E-Mode GaN switch comprising a large area GaN transistor switch D3 having an active area that is partitioned into a plurality of sections ($D3_1$ to $D3_n$) of the active area; the integrated GaN driver being integrated monolithically on the same substrate adjacent the active area of GaN transistor D3, the integrated GaN driver being distributed as a corresponding plurality of driver elements, each driver element being located on the substrate in close proximity to a respective one of the plurality of sections of D3 and coupled to the respective section of D3 by low inductance interconnects.

Preferably, both pull-up and pull-down driver elements are distributed. Alternatively, only the pull-down driver is distributed. The use of a distributed pull-down driver is key to clamping the pull-down of the device, and provides significant benefit, even if a single pull-up driver is shared between multiple sections of the power switching device. Alternatively, each of a plurality of driver elements may serve a sub-set of sections of the GaN power switch. Driver transistors are appropriately sized to optimize drive conditions for each section.

This device layout architecture helps to equalize interconnect track lengths and signal delays between respective driver elements and sections of the GaN FET that they drive. Also, appropriate sizing and routing of the source, drain and gate interconnect tracks between the driver circuitry and the GaN power switch helps to further reduce inductance.

For example, the distributed inductances of the interconnect tracks the gate output and return tracks are arranged to help reduce the loop inductance. In one embodiment, two layer tracks are arranged in parallel. In another embodiment three parallel tracks may be used so that a signal line is encompassed by drive lines, above and below the signal line. This arrangement may be made at a chip level or a packaging level or a plating level of the die metallization.

Thus, devices and systems are provided comprising distributed driver circuitry integrated on-chip with one or more high power E-Mode GaN switches. These devices and systems provide closer coupling of the driver circuitry and the GaN switches to reduce the effect of parasitic inductances, and mitigate or circumvent one or more limitations of known devices and systems.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION OF PREFERRED EMBODIMENTS

Embodiments of the present invention provide devices and systems comprising distributed driver circuitry for large area GaN power transistors. Large GaN transistors may be arranged as blocks or sections, for example as described in the Applicant's related International Patent Application No. PCT/CA2014/000762 (Publication No. 2015061881), entitled "Fault Tolerant Design for Large Area Nitride Semiconductor Devices", filed Oct. 28, 2014, which claims priority from U.S. Patent Application No. 61/896,871 filed Oct. 29, 2013. The large area GaN transistor disclosed therein comprises a plurality of transistor elements comprising transistor islands that are arranged as an array, in rows and columns. For example, transistor elements in each row are connected in parallel using conductive tracks, preferably using low inductance metal straps, e.g. relatively thick layers of copper RDL (Cu RDL), which form source, drain and gate interconnects running in a row-wise direction, to provide a plurality of transistor sections. Then, the row-wise transistor sections of the GaN transistor are connected in parallel with busses running in a column-wise direction.

Embodiments of a switching system comprising a large area E-mode GaN transistor, driven by an integrated on-chip driver and discrete pre-driver, are disclosed for example, in the above referenced PCT International application No. PCT/CA2015/00168 (Publication No. WO2015135072).

Figure 3:
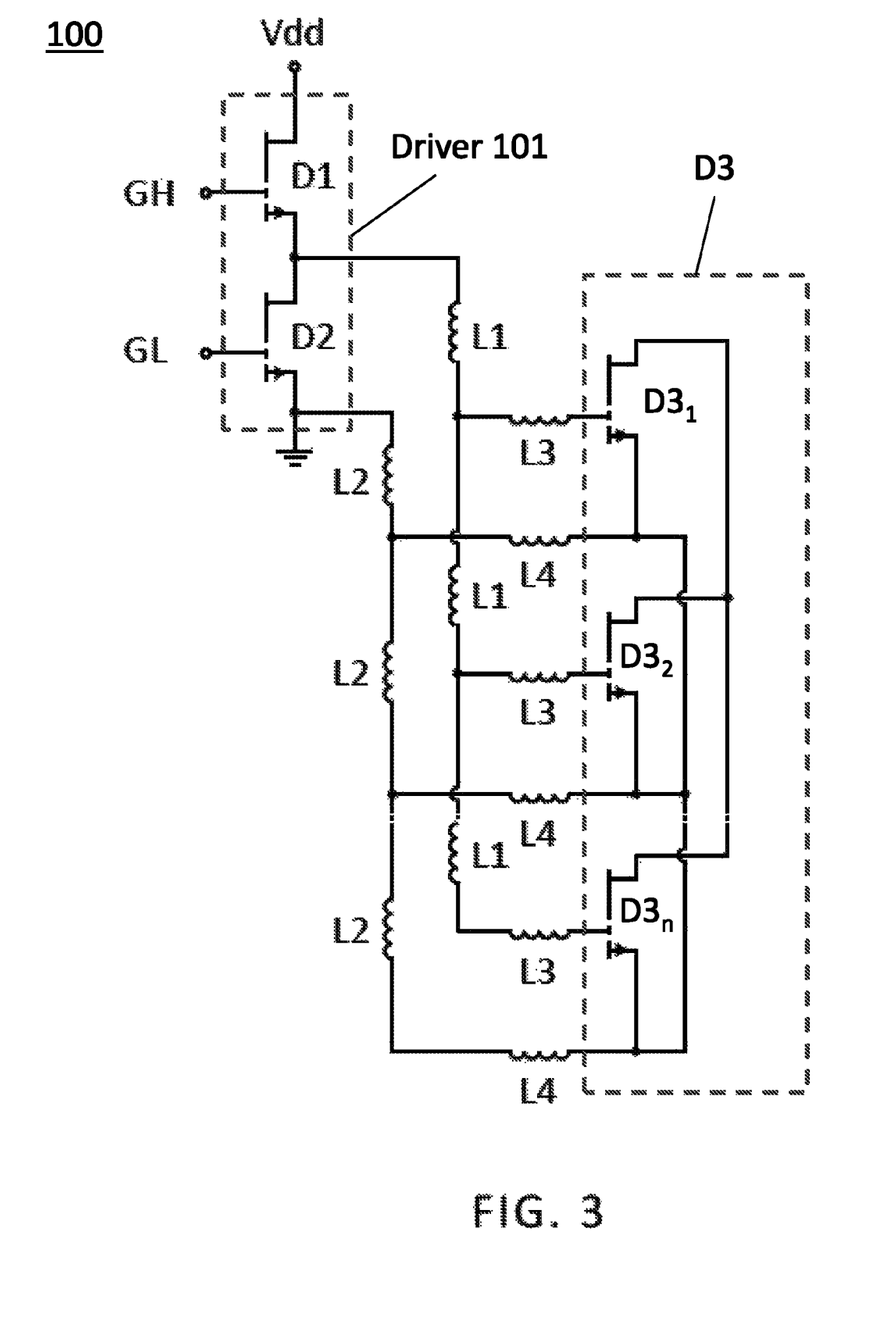
FIG. 3 (Prior Art) shows a circuit schematic representing a system comprising a large area GaN FET device D3 arranged as a plurality of sections $D3_1$ to $D3_n$, coupled to a single centralized driver circuit comprising driver transistors D1 and D2, to illustrate schematically parasitic inductances $L_1$, $L_2$, $L_3$, $L_4$ introduced by multiple connection paths or tracks of different lengths coupling the driver circuit to the large area GaN FET D3.

Referring to the circuit schematic of FIG. 3 (Prior Art), a switching system 100 comprises a large area GaN FET D3 with an integrated on-chip driver 101, comprising two smaller GaN FETs, D1 and D2. The large area GaN FET D3 is arranged as a plurality of sections $D3_1$ to $D3_n$. In this example, n=3. The on-chip driver 101 is centralized and comprises driver transistors D1 (pull-up) and D2 (pull-down), having respective gate inputs GH and GL. The centralized driver circuit 101 is placed on the GaN substrate adjacent the large area GaN FET D3. When the driver circuit 101, comprising driver transistors D1 (high-side/pull-up) and D2 (low-side/pull-down), is coupled to the plurality of sections of the large area GaN FET transistor D3, there may be significantly different lengths of interconnect tracks between the driver circuitry and the source, drain and gate connections of each section $D3_1$ to $D3_n$ of the GaN FET D3, which can result in dissynchronous operation at higher switching speeds. As represented schematically in FIG. 3, each segment, or length, of interconnect between the driver circuitry and sections of the GaN FET D3 contribute parasitic inductances ($L_1$, $L_2$, $L_3$ and $L_4$). Different lengths of interconnect extend between the driver circuitry to each section. This results in different inductances in the gate loop of each of the transistor sections $D3_1$ to $D3_n$, i.e. depending on the physical location of each section in the chip layout, relative to the location of the driver circuitry. For larger area transistors, this may result in significant differences in the inductances in the return gate loop of each section of the transistor D3.

Figures 5, 6:
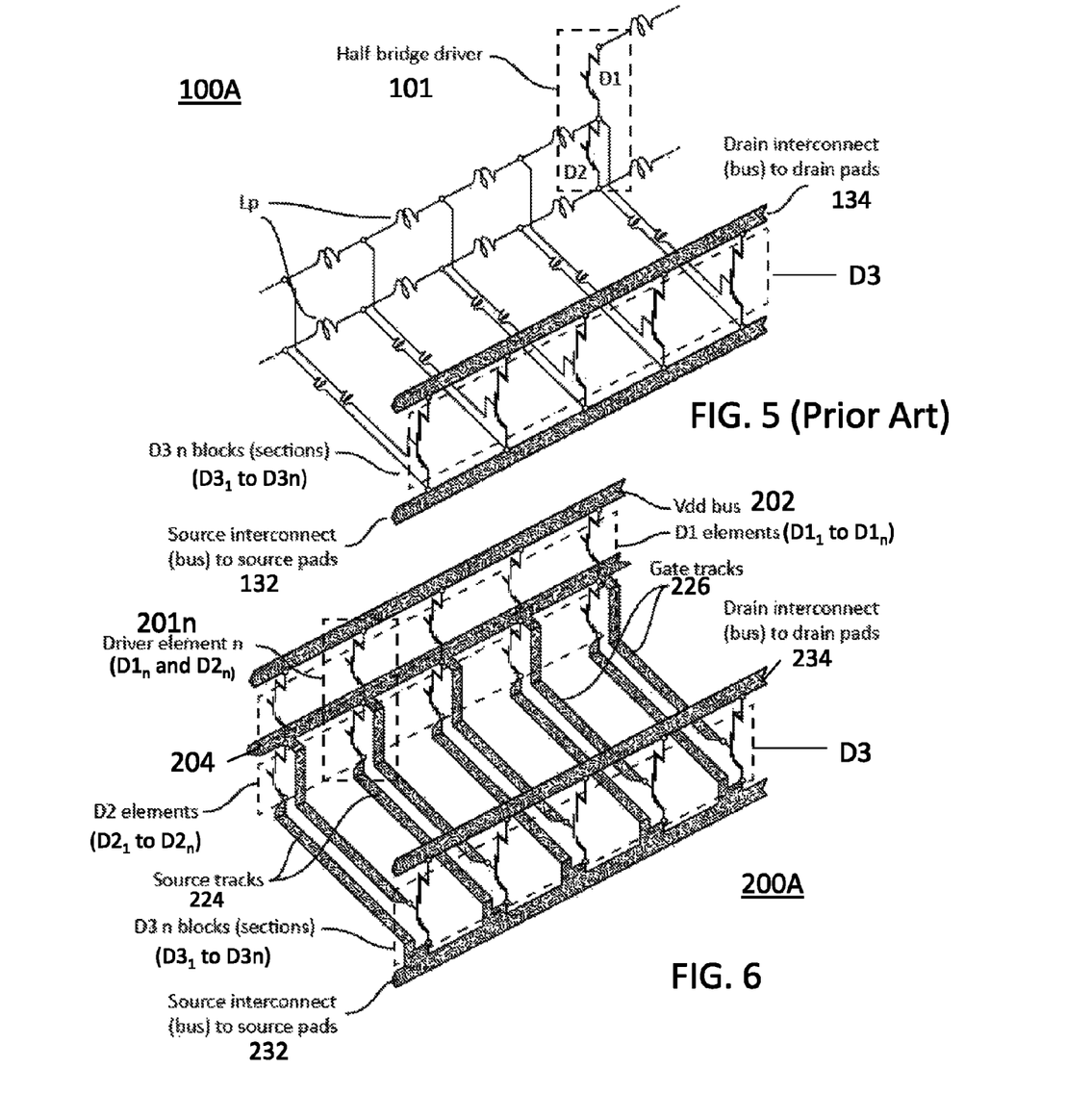
FIG. 5 (Prior Art) shows another schematic diagram representing a layout of the system shown in FIG. 3, showing parasitic capacitances $L_p$ of interconnect tracks to each section $D3_n$ of the large area transistor D3, and a source interconnect bus and a drain interconnect bus coupling the sections $D3_1$ to $D3_n$ in parallel.
FIG. 6 shows another schematic diagram representing a layout of the system, according to the embodiment shown in FIG. 5, comprising a large area GaN FET D3 comprising sections $D3_1$ to $D3_n$ and distributed driver circuitry wherein sections $D1_1$ to $D1_n$ and $D2_1$ to $D2_n$ of distributed driver transistors D1 and D2 are coupled to respective sections $D3_1$ to $D3_n$ of the large area GaN FET, and comprising low inductance source, drain and gate connection paths and tracks.

FIG. 5 shows an alternative representation 100A of the circuit shown in FIG. 3, having a centralized driver, to illustrate schematically the physical layout of the interconnect tracks and parasitic inductances Lp (i.e. $L_1$ to $L_4$ of FIG. 3) introduced by different lengths of tracks between the driver transistor D2 of the on-chip driver 101 and each section $D3_1$ to $D3_n$ of D3.

At higher switching speeds when switching losses are the dominant loss, stray parameters differentially present in the driver internal track interconnect circuitry prevent coherent operation of the main power switch D3. This creates a differential phase action, and results in dissynchronous operation, since the timing of signals to each section becomes out of parallel. That is, the plurality of transistor sections $D3_1$ to $D3_n$ may not turn on and off synchronously.

Figure 4:
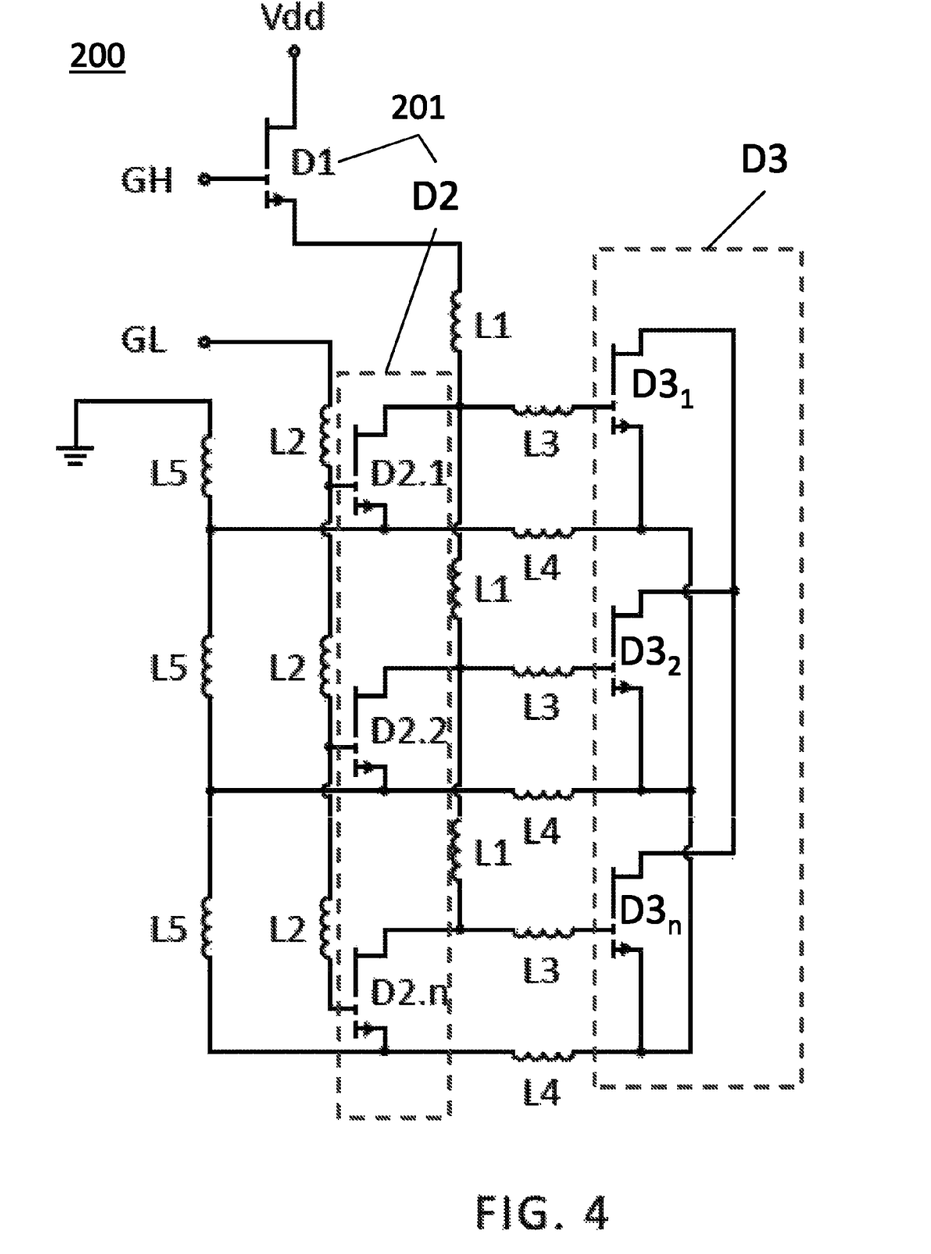
FIG. 4 shows a circuit schematic representing a system, according to an embodiment of the present invention, comprising a large area GaN FET D3, arranged as a plurality of sections $D3_1$ to $D3_n$, coupled to distributed driver circuitry comprising a pull-up driver transistor D1, and a distributed pull-down driver transistor D2 comprising a plurality of individual sections $D2_1$ to $D2_n$, each coupled to respective sections $D3_1$ to $D3_n$ of the large area GaN FET, to illustrate schematically parasitic inductances $L_1$, $L_2$, $L_3$, $L_4$, $L_5$ introduced by multiple connection paths or tracks coupling the driver circuit to the large area GaN FET D3.

A system 200 comprising a distributed driver arrangement 201 comprising driver transistors D1 and D2, according to an embodiment of the present invention, is shown schematically in FIG. 4, in which at least the low-side, pull-down, driver transistor D2 is distributed. That is, D2 comprises elements D2.1, D2.2, to D2.n, each driving respective sections $D3_1$ to $D3_n$ of the large area GaN FET D3. The driver elements D2.1, D2.2, to D2.n are placed in closer physical proximity to the respective sections of D3 that they drive. In this device architecture, the on-chip layout of the driver elements, with distributed placement of the driver elements relative to respective sections of the GaN FET D3, helps to equalize lengths of interconnect tracks, which influence factors such as loop inductance and signal delays, for each section of the GaN FET D3.

The distributed driver circuitry addresses the problem of dynamic unbalance. Optimum high speed operation is possible if the drivers are properly distributed such that each section $D3_n$ of the large power switch D3 has a nearly uniform driver condition. Thus, beneficially the pull-up driver D1 may also be similarly distributed, as illustrated schematically in FIG. 6, which shows a schematic physical layout where both pull-up and pull-down driver transistors D1 and D2 are distributed and placed in closer physical proximity to the respective sections $D3_1$ to $D3_n$ of D3 that they drive.

A system 200A comprising an integrated distributed driver according to the embodiment shown in FIG. 6 comprises a large area GaN transistor D3 arranged as a plurality of sections $D3_1$ to $D3_n$ integrated with a plurality of separate driver elements comprising drive transistor sections $D1_n$ and $D2_n$, each dedicated and sized appropriately to drive their respective sections $D3_n$ of the combined integrated device. Each individual driver element 201n, as referred to herein, is made up of two relatively small transistors, $D1_n$ and $D2_n$, i.e., connected in series to provide a pull-up driver transistor $D1_n$ and a pull-down driver transistor $D2_n$, the output of which is connected to drive the gate of a respective section $D3_n$ of the very large GaN power switch D3. The devices D1, D2 and D3 are E-mode GaN transistors.

Preferably, the source of the pull-down small transistor $D2_n$ of the driver element is connected as closely as feasible to the intrinsic source of the respective section $D3_n$ of the large GaN transistor D3 that it is dedicated to drive.

Thus, as illustrated in FIG. 6, the system 200A according to this embodiment comprises a plurality of driver elements each selectively connected to drive its appropriate section of the large GaN power switch. The driver transistors $D1_n$ and $D2_n$ are sized to provide optimum drive conditions, for each section $D3_n$.

The top transistor D1 of the driver comprises a GaN FET. The source electrode of the top side transistor D1 is connected to the output of the driver. The gate electrode of the top transistor D1 is driven from a pre-driver internally or externally provided. The bottom transistor D2 of the driver comprises a GaN FET. The drain of the bottom transistor D2 of the driver is connected to the output of the driver. The gate electrode of the bottom transistor D2 is driven from a pre-driver internally or externally provided.

One of the factors which contribute to the gate to source impedance is the inductance added by the interconnection busses to the gates of driver transistor elements $D1_n$ and $D2_n$.

From comparison of FIG. 5 and FIG. 6, it will be apparent that the gate loop inductance of a centralized driver is much higher than that for the distributed driver.

As represented in FIG. 6, two large power supply bus lines 202 are preferably provided for the driver elements so that many individual driver elements may be supplied with their power requirements. Electrodes are joined to form a driver output connection 204. Optionally the driver would be directly joined with no intermediate track 226 to the gate of the large power switching transistor D3.

Advantageously, the output track connection 226 of the driver element which drives a section of the gate of the large GaN power switch D3 and the aforementioned track connection 224 from the source of the bottom transistor D1 of the driver are magnetically mirrored so as to reduce the loop inductance of the drive circuit. The other electrode 202 of the driver is the drain of the top transistor D1 and this is connected to an external power source Vdd.

The conductive tracks, including the driver output and return conductive tracks, are provided by a suitable type of metallization layer that can provide tracks of relatively large dimensions and thicknesses. The tracks are also spaced as closely as possible within the limits of the space and within the limitations of the process parameters. The metal tracks are made as "substantial" as possible, i.e. metal layers having substantial thickness and line/track width to reduce inductance. Therefore, by means of proximity and sizing/layout of the interconnect tracks, the loop inductance of the driver circuitry is reduced significantly.

Figure 7:
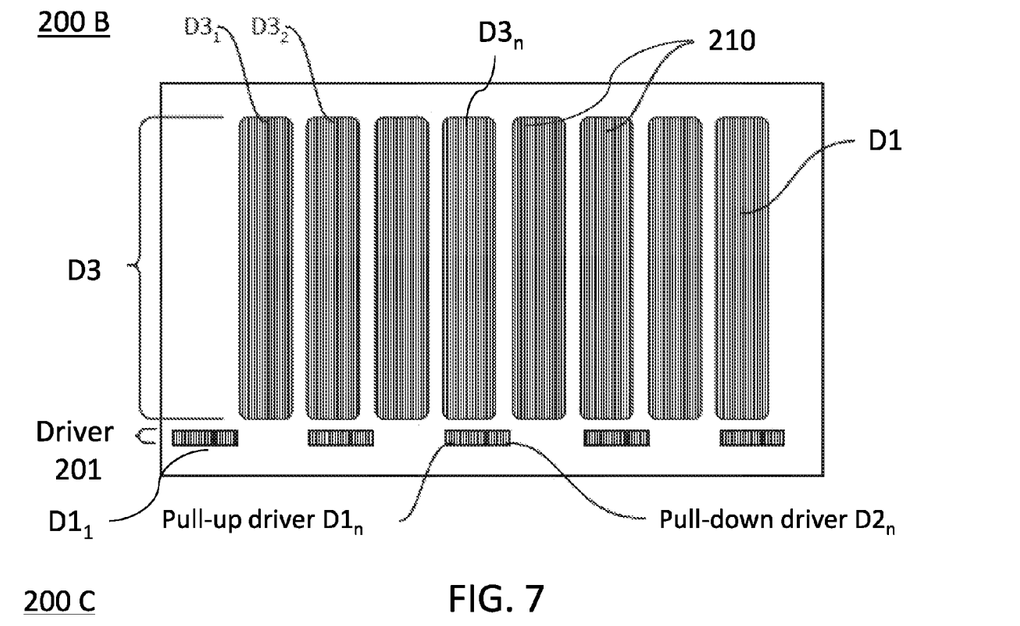
FIG. 7 shows schematically the physical layout of a device structure comprising part of a power switch, according to an embodiment of the invention, comprising a large area GaN FET D3 comprising a plurality of active areas and a distributed driver comprising distributed drive transistors D1 and D2 distributed as a plurality of elements driving respective sections $D3_1$ to $D3_n$ of the GaN FET D3.

An example of a physical layout or topology for a large area GaN FET D3 200B with on-chip distributed pull-up and pull-down driver transistors D1 and D2 is shown in FIG. 7. FIG. 7 shows schematically the physical layout of a device structure 200B comprising part of a power switch comprising a large area GaN FET D3 comprising a plurality of active areas 210 and a distributed driver 220 comprising distributed drive transistors D1 and D2 distributed as a plurality of elements $D1_1$ to $D1_n$ and $D2_1$ to $D2_n$, each driving respective sections $D1_1$ to $D3_n$ of the GaN FET D3.

Figure 8:
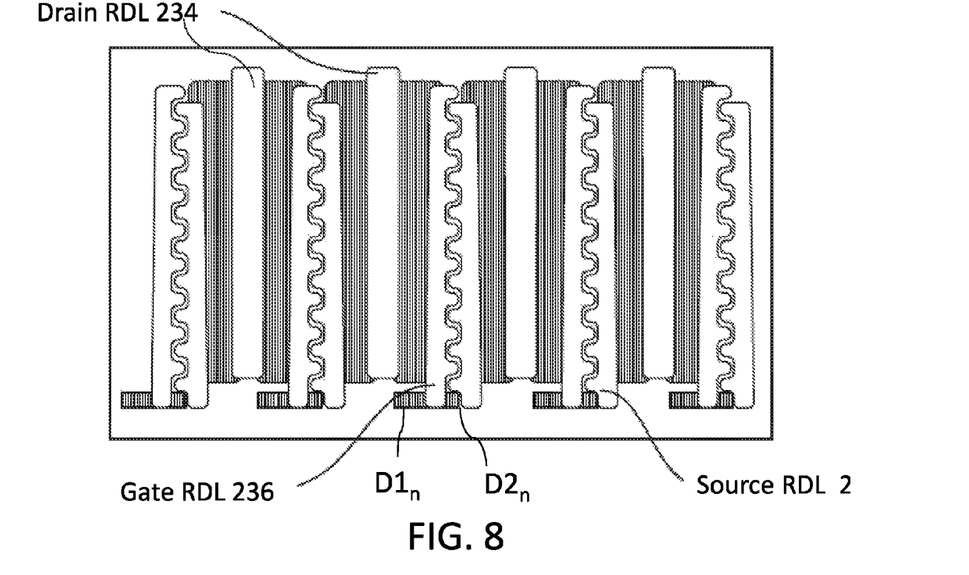
FIG. 8 shows schematically another view of the physical layout of a device structure comprising the power switch of FIG. 7, showing source, drain and gate interconnect metallization layers of the GaN FET D3 comprising a metal Redistribution Layer (RDL), with respective source and gate connections to corresponding elements of the distributed the pull-up driver D1 and pull-down driver D2.

FIG. 8 shows schematically another view of the physical layout of a device structure 200C comprising the power switch shown in of FIG. 7, and further comprising overlying source, drain and gate interconnect metallization layers 232, 234 and 236 of the GaN FET sections $D3_n$, comprising RDL metal, with respective source and gate connections to corresponding elements of the distributed pull-up drivers $D1_n$ and pull-down drivers $D2_n$.

Figure 9:
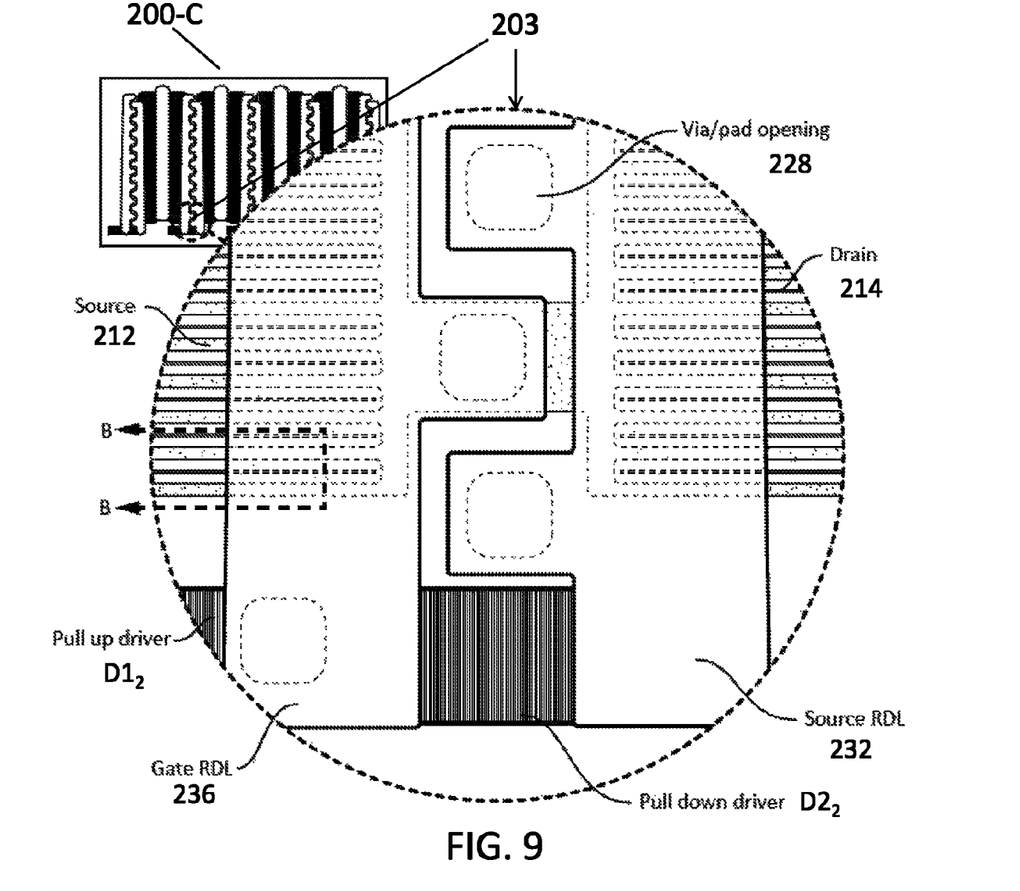
FIG. 9 shows an enlarged view of part of FIG. 8, representing part of the source, drain and gate interconnect metallization with interconnections to the respective elements of the pull-up and pull-down driver transistors.

FIG. 9 shows an enlarged view of part 203 of the structure 200C shown in FIG. 8, representing part of the source, drain and gate interconnect metallization, of section $D3_n$ of GaN FET D3, which includes the Source RDL 232 and Gate RDL 236 providing low inductance interconnections to the respective elements of the pull-down and pull-up driver transistors, $D1_n$ and $D2_n$. Also shown are parts of the drain electrodes 114, and source electrodes 12, which are interconnected to respective portions of the overlying drain metal RDL 236 and source metal RDL 232 by via/pad openings 228

The physical layout also reduces the overshoot voltage drive for the separated gates of the sections of the large area GaN transistor switch.

Figure 10:
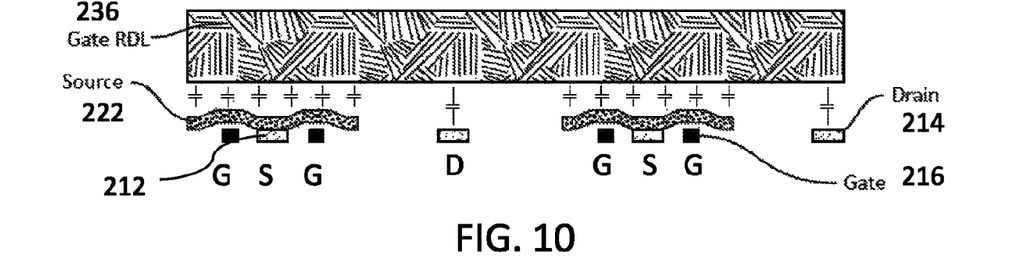
FIG. 10 shows a schematic cross-sectional view of some parts of FIG. 9, through line B-B of FIG. 9.

FIG. 10 shows a schematic cross-sectional view of some parts of FIG. 9, through line B-B of FIG. 9. As illustrated in the schematic cross-sectional view in FIG. 10, the driver output bus 236 may be juxtaposed above large source connected field plates 222 so as to create a larger gate-source capacitance $C_{gs}$. This larger gate-source capacitance improves the Miller Ratio.

The distributed inductances of the tracks, between the distributed high and pull-down transistors and the sections of the GaN switch that they drive, are preferably arranged to reduce the loop inductance of the driver output and return tracks. For example, two layer tracks are arranged in parallel, as illustrated in FIG. 4, to reduce the loop inductance, i.e. from the source of the high-side pull-up driver and the return path from source of the GaN switch, and from the drain of the low-side pull-down driver and the return path to the source of the GaN switch.

By way of example, a large area GaN die may comprise a die area of ~100 mm², for example die sizes, such as, 2 mm×6 mm, ~10 mm×~10 mm, and potentially up to a full reticle size, e.g. 20 mm×20 mm. An E-mode lateral GaN FET with high voltage/high current capability, e.g. 650 V/100 A, may for example have a gate width Wg of 1000 mm. Driver transistors D1 and D2 are smaller E-mode lateral GaN transistors, e.g. having gate widths of 60 mm and 30 mm, respectively (see for example, J. Roberts et al., Integrated Power Packaging (IWIPP, 2015 IEEE International Workshop on, 3-6 May 2015).

It will be apparent that variations and modifications to these specific embodiments may be made to meet other processes and design aims. For example with different number of sections n of the large GaN transistor D3 and various physical arrangements for the on-chip layout of the respective elements of the driver transistors D1 and D2 relative to D3.

For example, in other embodiments, not illustrated, alternative layout architectures may be used. For example, in one embodiment the driver output and return connection tracks are laid out at the same level in lateral close proximity to each other. In another embodiment, the driver output and return tracks are laid out on different levels so as to allow vertical close proximity. In yet another embodiment, multi-level metallization provides three vertical tracks, so that the output track of the driver is effectively enclosed within a pair of return tracks. The arrangement of interconnect tracks may be made at a chip level, or a packaging level, or a plating level of the die metallization, or a combination of these.

Embodiments with various arrangements for the distributed driver circuitry are envisaged, in which both the driver and a pre-driver may be fully integrated on chip, or a discrete pre-driver may be used.

One embodiment comprises a single driver for the entire circuit with a large driver top and bottom, using more optimized layout and routing, e.g. by locating a single driver more optimally and centrally relative to the active area of the GaN transistor switch to reduce inductance, and selecting the routing and sizing of interconnect tracks to reduce inductance, and minimize dissynchronous operation.

Another embodiment comprises a distributed driver with a plurality of driver elements, each driver element serving several sections or a subset of sections of the GaN transistor switch (i.e. the driver is partially distributed).

In another embodiment, both high and pull-down drivers that are distributed so each of the plurality of driver elements serves a respective one of the plurality of sections of the GaN transistor switch.

In another embodiment, only the pull-down driver is distributed, while a centralized/common pull-up driver is provided. The use of a distributed pull-down driver is key to clamping down the bottom device and offers significant beneficial effect, even if the pull-up driver is not distributed.

Referring to the above mentioned PCT International patent application No. PCT/CA2015/00168 (Publication No. WO2015135072), a GaN device or GaN chip is disclosed comprising a high voltage/high current GaN E-mode transistor switch D3 with on-chip integrated E-mode GaN driver transistors D1 and D2. The latter is referred to by the Applicant as a "Drive Assist™" GaN E-mode transistor switch and the driver transistors D1 and D2 are referred to as the upper and lower "drive assist" transistors. When driven by an appropriately designed external driver, D1 operates to provide the drive voltage for the gate G of the GaN power switch D3 and D2 operates to clamp the gate G of D3 to the source S of D2 via the internal source-sense Kelvin connection. Moreover, the integrated upper drive assist transistor D1 assists in providing noise immunity to the gate of D3, e.g. voltage spikes coming in on the gate of D3; and the integrated lower drive assist transistor D2, assists in preventing false turn-on due to the Miller effect during a switching transition of D3. Unexpectedly, it has been observed that the integrated lower drive assist transistor D2 also helps significantly to provide noise immunity to the gate of D3, i.e. by clamping the gate of D3 to the source to hold D3 off in the presence of noise voltage spikes coming in externally on the gate or source sense lines.

Effect of a Distributed Gate Driver on a Half Bridge Circuit

A half-bridge circuit has to prevent against a cross-conduction which results in short circuit between the high and low rail and damage the switching transistors. In fact, a dead time exists between the on-state of the two transistors for this very purpose in a half-bridge driver. However, there are conditions when unwanted cross-conduction may occur. For example, referring to FIG. 6, if transistors D1 and D2 transition from both off to D1 on and D2 off, the rail voltage may suddenly drop on the drain of D2 and voltage is divided on the gate of this transistor. In order to make sure that this voltage does not turn on this transistor, care has to be taken to insure that the gate to source impedance is significantly smaller than the drain to source impedance.

While devices and systems according to specific embodiments have been described by way of example, it will be appreciated that in other embodiments, other specific numbers of driver elements and other specific layout arrangements of sections of the large area GaN FET may be used.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A GaN switching device comprising:
a large area lateral GaN power transistor (GaN FET) arranged as a plurality of sections, and
a distributed driver comprising a plurality of driver elements, each driver element comprising a pull-up driver transistor and a pull-down driver transistor connected in series, wherein the output of each one of the distributed driver elements is selectively connected to drive a respective one of the sections of the large GaN power transistor.

2. The GaN switching device of claim 1, wherein the pull-down driver transistor is distributed as a plurality of pull-down driver transistor elements, each pull-down driver transistor element being arranged for driving a respective section of the GaN power transistor and wherein a single pull-up driver transistor is provided for driving all sections of the GaN power transistor.

3. The GaN switching device of claim 1, wherein both the pull-up driver transistor and pull-down driver transistor are distributed as a plurality of distributed driver elements, each driver element comprising an individual pull-down driver transistor and an individual pull-up driver transistor in series and providing a gate output for driving its respective section of the GaN power transistor.

4. The GaN switching device of claim 1, wherein the plurality of sections of the GaN FET and the plurality of driver elements are arranged to provide a layout wherein each one of the distributed driver elements is placed in close physical proximity to the respective one of the sections of the large GaN FET that it drives.

5. The GaN switching device of claim 1, wherein each one of the driver elements is placed in close physical proximity to the respective one of the sections of the large GaN power switch, and wherein routing and sizing of respective interconnect tracks connecting the distributed driver elements and respective sections of GaN switch are selected to minimize loop inductance.

6. The device of claim 1, wherein the gate output track connection of the driver element which drives a section of the gate of the large GaN power switch and the return track connection to the source of the pull-down driver transistor of the driver element are magnetically mirrored so as to reduce the loop inductance.

7. The device of claim 1, wherein the routing and sizing of interconnect tracks for the gate output and return between each driver element and respective sections of the GaN power switch are arranged to reduce the loop inductance.

8. The device of claim 7, wherein said tracks comprise two layer tracks arranged in parallel.

9. The device of claim 7, wherein said tracks comprise three parallel tracks wherein a signal line is encompassed by drive lines, above and below the signal line.

10. A GaN switching device comprising:
a substrate;
an enhancement mode (E-Mode) GaN switch and an integrated GaN driver formed on the substrate;
the E-Mode GaN switch comprising a large area lateral GaN transistor switch D3 having an active area that is partitioned into a plurality of sections ($D3_1$ to $D3_n$);
the integrated GaN driver being integrated monolithically on the substrate adjacent the active area of GaN transistor D3; and
the integrated GaN driver being distributed as a corresponding plurality of driver elements, each driver element being located on the substrate in close proximity to a respective one of the plurality of sections of D3 and coupled to the respective section of D3 by low inductance interconnects.

11. A GaN switching device according to claim 10, wherein each driver element comprises a first, pull-up E-Mode GaN driver transistor D1 and a second, pull-down E-Mode GaN driver transistor D2;
the drain of D1 being coupled to Vcc, and the source of D1 being coupled to the drain of D2 at node N, which is coupled to the gate of the respective section of D3, and an internal source-sense connection closely coupling the source of the respective section of D3 and the source of D2, such that the first transistor D1 delivers a drive voltage to the gate of the respective section of the GaN transistor switch D3, and the second transistor D2 clamps the gate of the respective section the GaN transistor switch D3 by means of the internal source-sense connection $SS_{internal}$;

inputs for coupling to a pre-driver supplying gate drive voltages to the gates of D1 and D2 of each driver element and optionally to the gates of each section of D3, and an external source-sense connection $SS_{external}$ for coupling to the pre-driver.

12. The device of claim 10, wherein each section $D3_n$ of D3 has a respective individual driver element comprising a pull-up driver element $D1_n$, and a pull-down driver element $D2_n$.

13. The device of claim 10, wherein each section $D3_n$ of D3 is coupled to a respective individual pull-down driver element $D1_n$, and wherein a single pull-up driver element D2 is coupled to the plurality of sections of D3.

14. The device of claim 11, wherein each section $D3_n$ of D3 has a respective individual driver element comprising a pull-up driver $D1_n$ and a pull-down driver $D2_n$.

15. The device of claim 11, wherein each section $D3_n$ of D3 is coupled to a respective individual pull-down driver element $D1_n$, and wherein a single pull-up driver element D2 is coupled to a plurality of sections of D3.

* * * * *